United States Patent
Feser et al.

(10) Patent No.: US 11,765,841 B2
(45) Date of Patent: Sep. 19, 2023

(54) CONTROL PANEL FOR AN APPARATUS, IN PARTICULAR FOR A DOMESTIC APPLIANCE, AND A METHOD FOR ASSEMBLING SAID CONTROL PANEL

(71) Applicant: ELECTROLUX APPLIANCES AKTIEBOLAG, Stockholm (SE)

(72) Inventors: Jürgen Feser, Rothenburg ob der Tauber (DE); Sebastian Boss, Rothenburg ob der Tauber (DE); Klaus Winkelmann, Rothenburg ob der Tauber (DE); Alessandro Parrella, Forli Cesena (IT)

(73) Assignee: Electrolux Appliances Aktiebolag, Stockholm (SE)

( * ) Notice: Subject to any disclaimer, the term of this patent is extended or adjusted under 35 U.S.C. 154(b) by 196 days.

(21) Appl. No.: 17/436,006

(22) PCT Filed: Feb. 28, 2020

(86) PCT No.: PCT/EP2020/055221
§ 371 (c)(1),
(2) Date: Sep. 2, 2021

(87) PCT Pub. No.: WO2020/182487
PCT Pub. Date: Sep. 17, 2020

(65) Prior Publication Data
US 2022/0151084 A1    May 12, 2022

(30) Foreign Application Priority Data
Mar. 13, 2019  (EP) .................................. 19162650

(51) Int. Cl.
*H05K 5/00* (2006.01)
*D06F 34/28* (2020.01)
*A47L 15/42* (2006.01)

(52) U.S. Cl.
CPC ........ *H05K 5/0017* (2013.01); *A47L 15/4293* (2013.01); *D06F 34/28* (2020.02)

(58) Field of Classification Search
None
See application file for complete search history.

(56) References Cited

U.S. PATENT DOCUMENTS 6,157,423 A * 12/2000 Stonebraker ......... H05K 5/0017
                                                    345/905
9,732,963 B2 * 8/2017 Kozinski .................. F24C 5/16
(Continued)

FOREIGN PATENT DOCUMENTS

DE       19723403      12/1998
DE     202013011528    11/2014
(Continued)

OTHER PUBLICATIONS

International Search Report and Written Opinion for PCT/EP2020/055221, dated Jun. 3, 2020, 10 pages.

*Primary Examiner* — Xanthia C Cunningham
(74) *Attorney, Agent, or Firm* — Pearne & Gordon LLP

(57) ABSTRACT

The present invention relates to a control panel for an apparatus, in particular for a domestic appliance. The control panel (10) comprises at least one front panel (12) including at least one cut-out (14). The control panel (10) comprises at least one inner panel (16) including a peripheral rabbet (18). Said peripheral rabbet (18) encloses at least partially the circumference of the inner panel (16), so that a smaller flat front portion and a bigger flat rear portion of said inner panel (16) are formed. The control panel (10) comprises at least one support frame (20) including at least one recess (22) at its front side. The support frame (20) is connected or connectable to the rear side of the front panel (12). The inner panel (16) is arranged or arrangeable between the front panel (12) and the support frame (20), so that the flat front portion (Continued)

Figure 1:
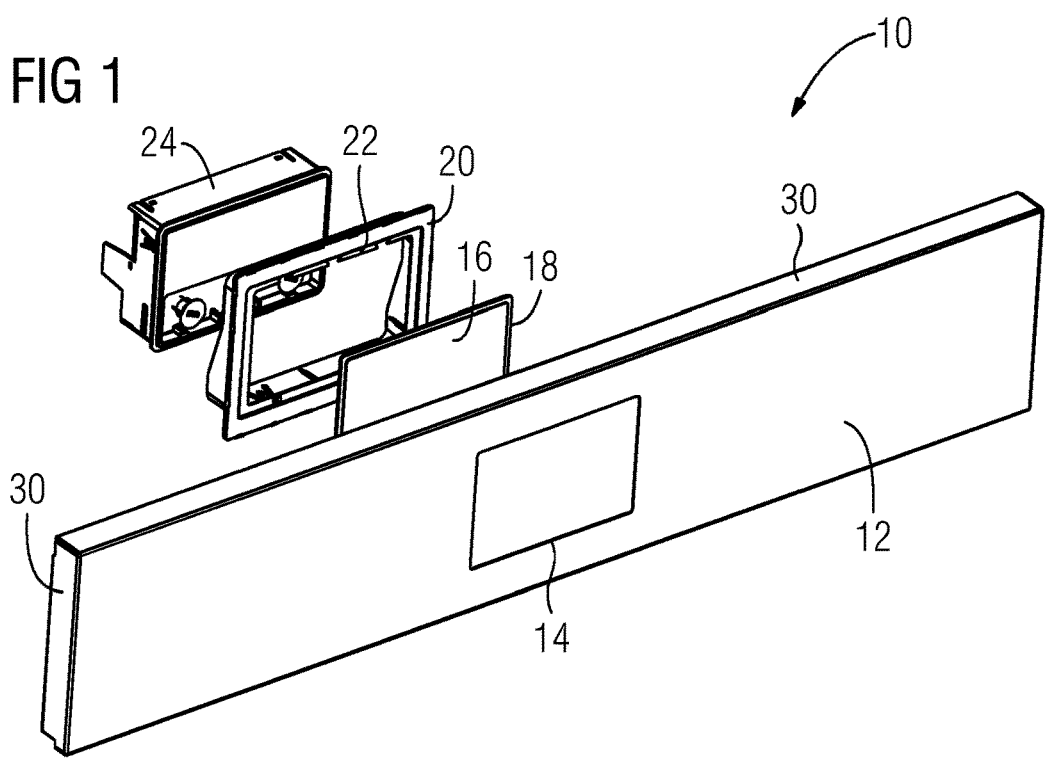

of the inner panel (16) is received or receivable by the cut-out (14) of the front panel (12), while the flat rear portion of the inner panel (16) is received or receivable by the recess (22) of the support frame (20). Further, the present invention relates to a method for assembling a control panel for an apparatus, in particular for a domestic appliance.

17 Claims, 8 Drawing Sheets

(56) References Cited

U.S. PATENT DOCUMENTS

| | | | |
|---|---|---|---|
| 2015/0043135 A1* | 2/2015 | Bas | D06F 34/28 361/679.01 |
| 2015/0160504 A1* | 6/2015 | Woo | B60K 37/04 349/58 |
| 2015/0313030 A1* | 10/2015 | Ren | H05K 5/0234 248/688 |
| 2017/0139490 A1* | 5/2017 | Morandini | D06F 34/28 |
| 2017/0183808 A1* | 6/2017 | De Pellegrin | D06F 34/34 |

FOREIGN PATENT DOCUMENTS

| | | |
|---|---|---|
| EP | 1990698 | 11/2008 |
| EP | 2360308 | 8/2011 |

* cited by examiner

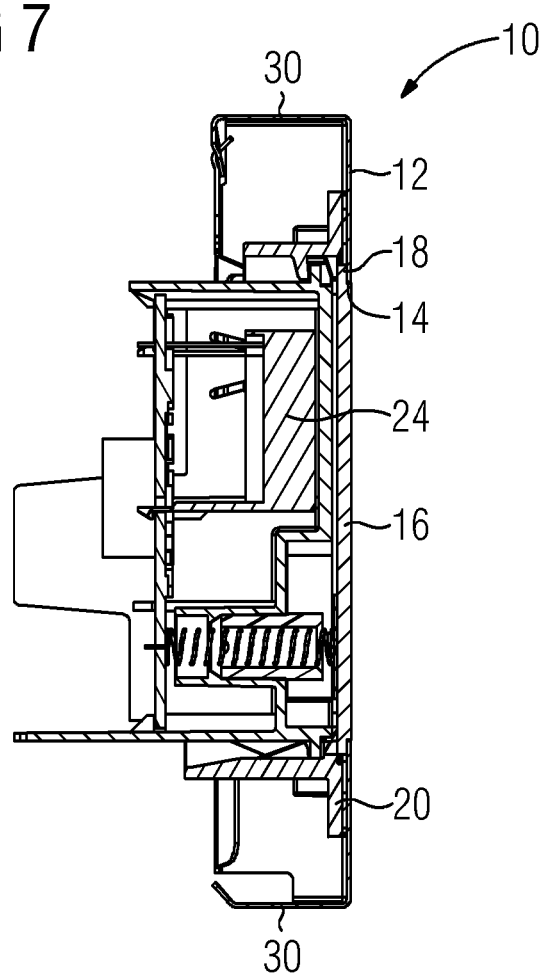
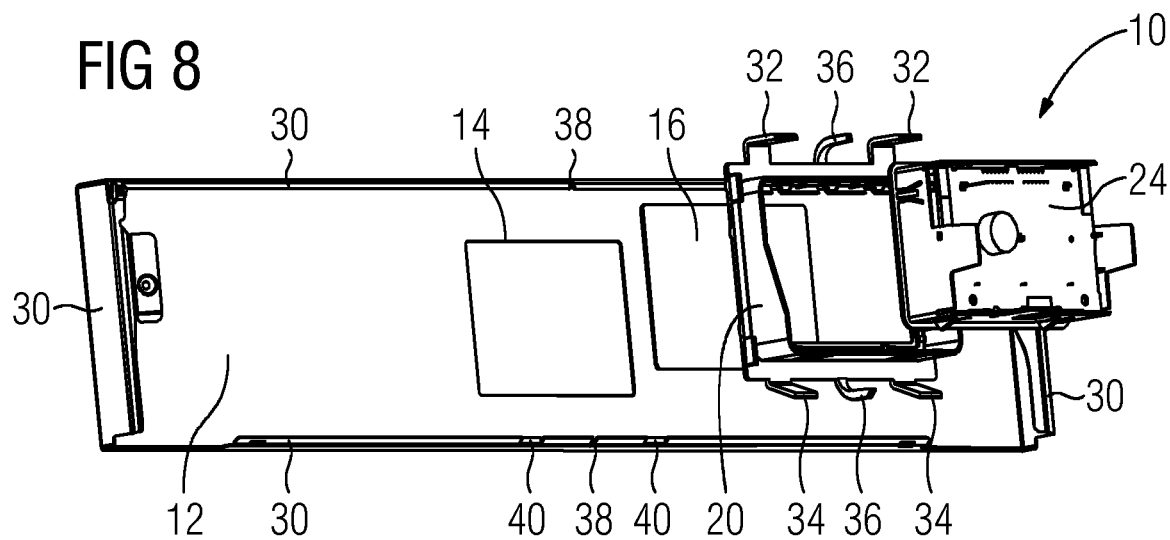

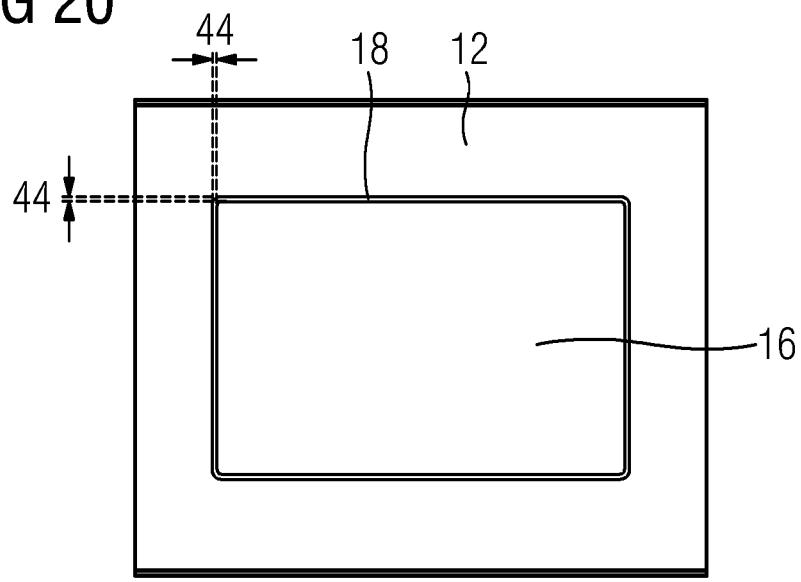
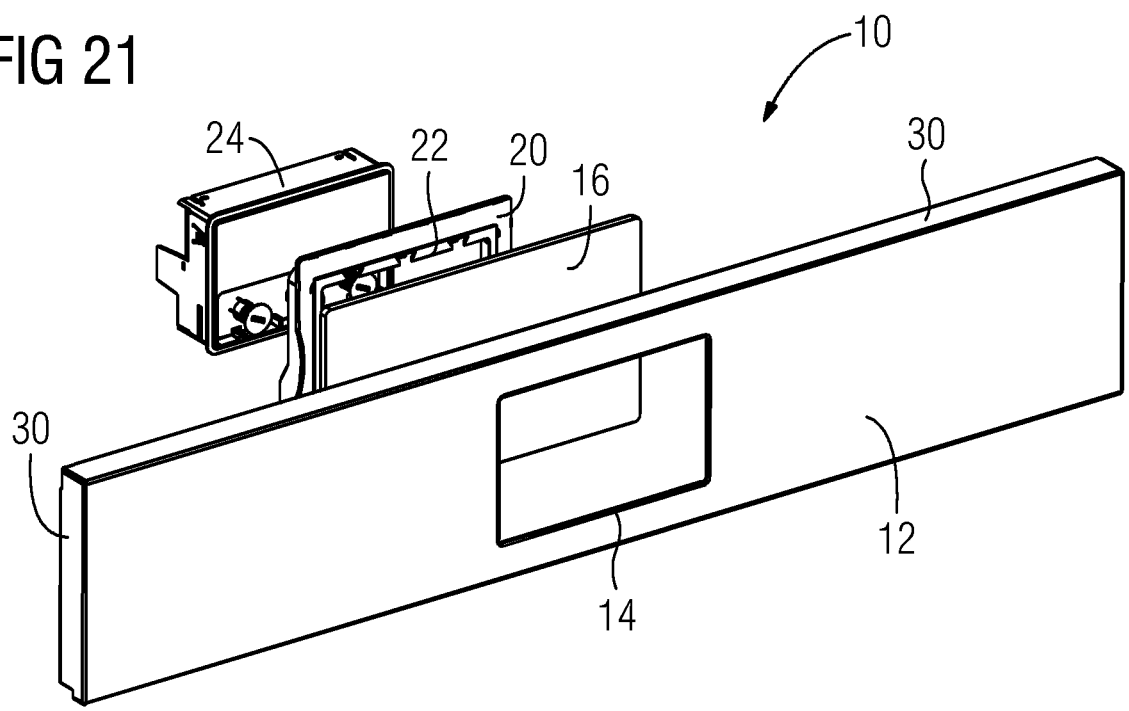

CONTROL PANEL FOR AN APPARATUS, IN PARTICULAR FOR A DOMESTIC APPLIANCE, AND A METHOD FOR ASSEMBLING SAID CONTROL PANEL

The present invention relates to a control panel for an apparatus, in particular for a domestic appliance. Further, the present invention relates to a method for assembling a control panel for an apparatus, in particular for a domestic appliance. Moreover, the present invention relates to an apparatus, in particular a domestic appliance.

Usually, a control panel for a domestic appliance comprises a transparent or partially transparent inner panel arranged behind is a cut-out of a front panel. FIG. 21 illustrates a schematic exploded perspective front view of the control panel 10 according to the prior art. The control panel 10 comprises the front panel 12, the inner panel 16, a support frame 20 and a user interface 24. The front panel 12 includes the cut-out 14. The inner panel 16 is transparent or at least partially transparent. The inner panel 16 is attached at the rear side of the front panel 12 and behind the cut-out 14. The support frame 20 is fixed at the rear side of the inner panel 16. In turn, the user interface 24 is snapped in at the support frame 20. However, the cut-out 14 forms an edge in front of the inner panel 16.

EP 1 990 698 A1 discloses a control panel, wherein the inner panel includes a peripheral rabbet enclosing the circumference of said inner panel. The inner panel consists of a flat front portion and a flat rear portion, wherein the large-area side of the flat front portion is smaller than the large-area side of the flat rear portion. The flat front portion corresponds with the cut-out of the front portion, while the flat rear portion corresponds with the support frame. For assembling the control panel, the flat rear portion of the inner panel is snapped in at the support frame and subsequently said support frame is glued by an adhesive tape at the rear side of the front panel. This control panel provides the flush surface on the front sides of the front panel and the inner panel. However, said control panel cannot be assembled automatically.

It is an object of the present invention to provide a control panel for an apparatus, which provides a flush surface on the front sides of the front panel and the inner panel, wherein said control panel can be assembled automatically.

According to the present invention a control panel for an apparatus, in particular for a domestic appliance, is provided, wherein:
 the control panel comprises at least one front panel including at least one cut-out,
 the control panel comprises at least one inner panel including a peripheral rabbet,
 the peripheral rabbet encloses at least partially the circumference of the inner panel, so that a smaller flat front portion and a bigger flat rear portion of said inner panel are formed,
 the control panel comprises at least one support frame including at least one recess at its front side,
 the support frame is connected or connectable to the rear side of the front panel,
 the inner panel is arranged or arrangeable between the front panel and the support frame, so that the flat front portion of the inner panel is received or receivable by the cut-out of the front panel, while the flat rear portion of the inner panel is received or receivable by the recess of the support frame.

The core of the present invention is that the support frame is directly connected to the rear side of the front panel, wherein the inner panel is arranged between said support frame and front panel. A separate fixation of the inner panel is not necessary. The peripheral rabbet effectuates that the inner panel consists of the flat front portion and the flat rear portion, wherein said flat front portion and flat rear portion form a single-piece part. The flat front portion of the inner panel is complementary to the cut-out of the front panel, while the flat rear portion of said inner panel is complementary to the recess of the support frame. The flat front portion of the inner panel inside the cut-out of the front panel allows a flush surface at the front sides of said front panel and inner panel. The control panel may be automatically assembled by a robot.

Preferably, the inner panel is at least partially transparent.

Further, the control panel may comprise at least one user interface fixed or fixable at the rear side of the support frame.

In particular, the user interface is fixed or fixable at the rear side of the support frame by at least one snap-in mechanism. The snap-in mechanism allows an automatic fixation of the user interface at the rear side of the support frame, so that the complete control panel can be assembled automatically.

Furthermore, the cut-out of the front panel is marginally bigger than the flat front portion of the inner panel, so that a narrow gap is formed between the circumferences of the cut-out of the front panel and the flat front portion of the inner panel. By this way, the front sides of the front panel and inner panel appear as a homogeneous surface.

Moreover, the recess of the support frame is bigger than the flat rear portion of the inner panel, so that a gap is formed between the circumferences of the recess of the support frame and the flat rear portion of the inner panel. This gap allows that manufacturing tolerances of the inner panel and/or the support frame can be compensated. The gap facilitates the automatic assembling of the control panel.

In particular, the gap between the circumferences of the recess of the support frame and the flat rear portion of the inner panel is bigger than the narrow gap between the circumferences of the cut-out of the front panel and the flat front portion of the inner panel.

According to one embodiment, the support frame is fixed or fixable at the rear side of the front panel by gluing. Optionally, one or more borders of the flat rear portion of the inner panel include corrugations. Said corrugations improve that a part of the glue flows into the space between the recess of the support frame and the borders of the flat rear portion of the inner panel.

According to another embodiment, the support frame is fixed or fixable at the rear side of the front panel by clamping said support frame between two opposite foldings arranged at the rear side of the front panel, wherein preferably the foldings are arranged at two opposite borders of said front panel.

For example, the support frame includes hook elements and/or snap-in elements for hooking and/or snapping, respectively, said support frame into the foldings of the front panel. A hang-in and/or snap-in mechanism is formed between the support frame and front panel.

Preferably, the support frame includes at least one locating pin inserted in or insertable into a corresponding notch formed in the folding of the front panel. The locating pin and the notch contribute to an easy automatic assembling of the control panel.

Further, the present invention relates to a method for assembling a control panel for an apparatus, in particular for a domestic appliance, wherein the method comprises the steps of:

providing at least one front panel including at least one cut-out, providing at least one inner panel including a peripheral rabbet enclosing at least partially the circumference of said inner panel, so that a smaller flat front portion and a bigger flat rear portion of said inner panel are formed, providing at least one support frame including at least one recess at its front side, inserting the flat front portion of the inner panel into the cut-out of the front panel, connecting the support frame to the rear side of the front panel, so that the flat rear portion of the inner panel is received by the recess of the support frame and the inner panel is arranged between the front panel and the support frame.

This method allows an automatic assembling of the control panel by a robot. The support frame is directly connected to the rear side of the front panel. The inner panel is arranged between the support frame and the front panel. The separate fixation of the inner panel is not necessary.

According to one embodiment, the support frame is connected to the rear side of the front panel by:

depositing at least one glue track onto the rear side of the front panel, and setting the support frame onto said glue track.

Alternatively, the glue track may be deposited on the front side of the support frame.

According to another embodiment, the support frame is connected to the rear side of the front panel by clamping said support frame between two opposite foldings arranged at the rear side of the front panel, wherein preferably the foldings are arranged at two opposite borders of said front panel.

The method may be provided for assembling the control panel mentioned above.

Moreover, the present invention relates to an apparatus, in particular a domestic appliance, wherein the apparatus comprises the control panel mentioned above and/or said control panel is assembled by the aforementioned method.

Novel and inventive features of the present invention are set forth in the appended claims.

Figure 2:
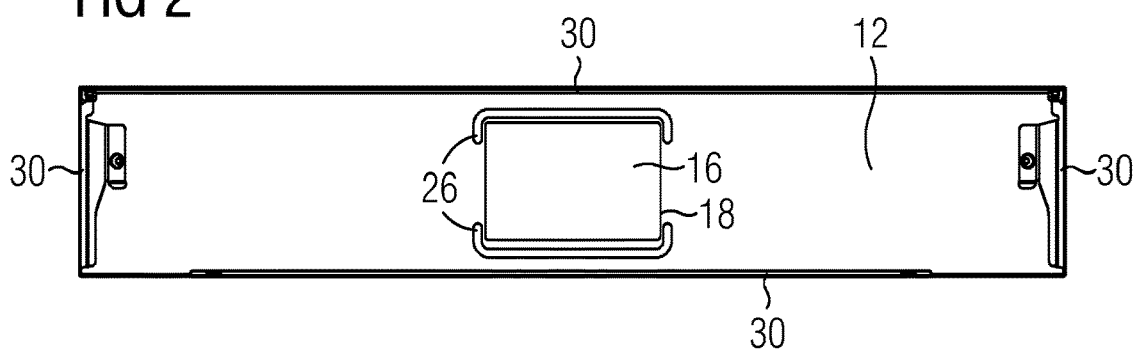
Figure 3:
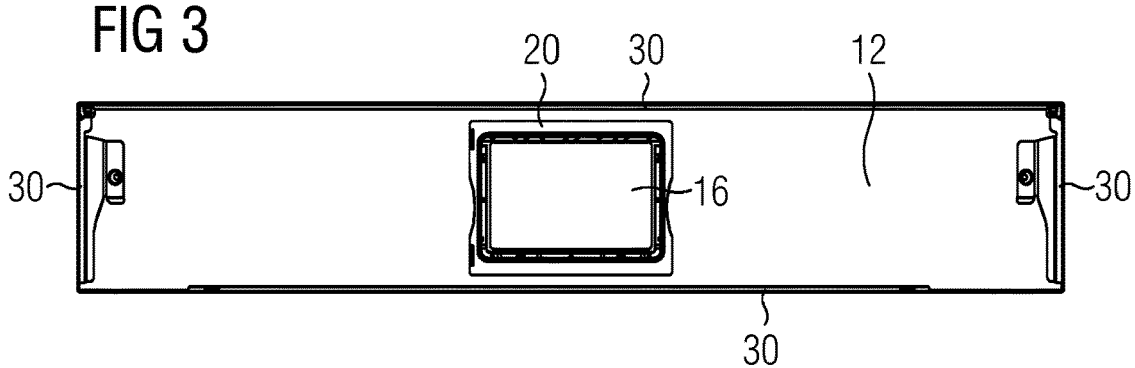
Figure 4:
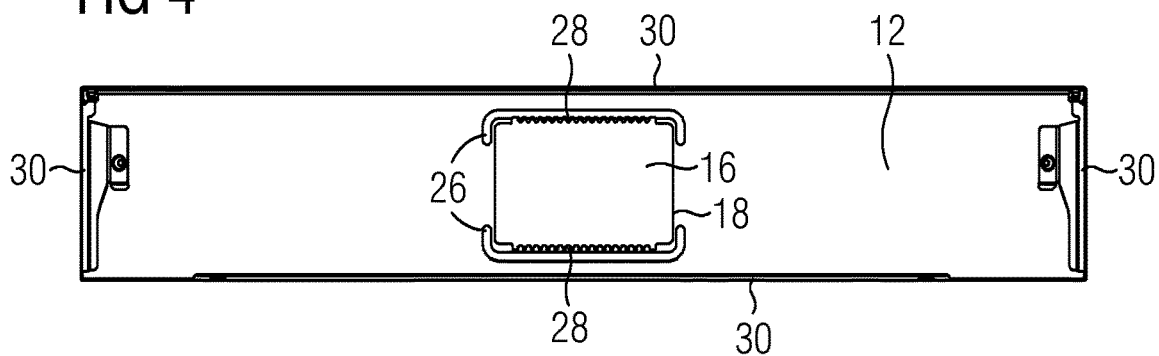
Figure 5:
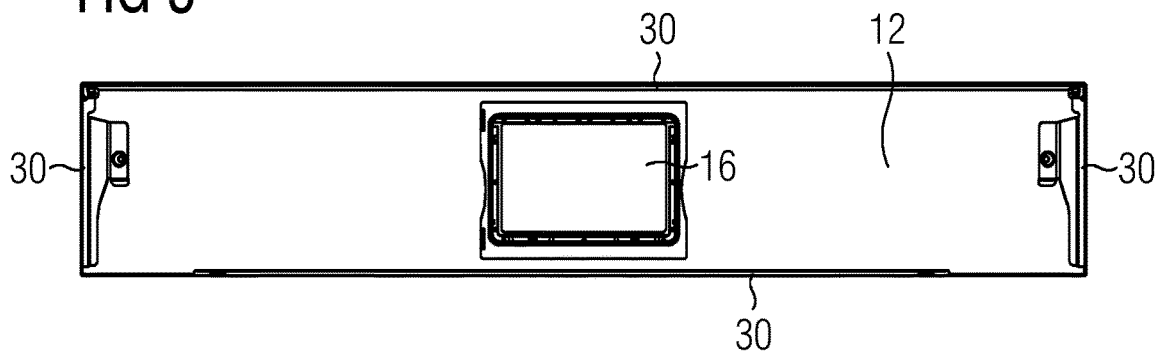
Figure 6:
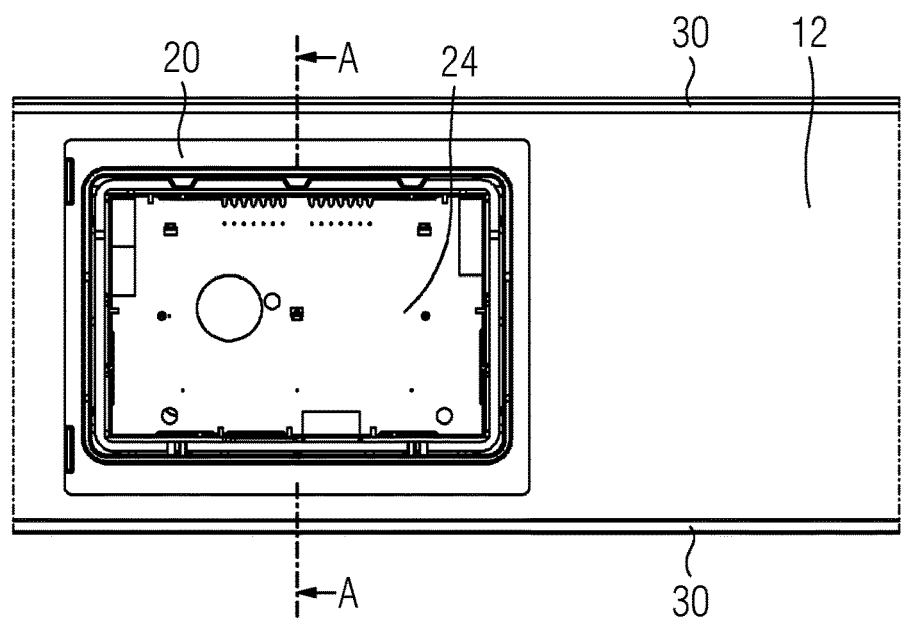
Figure 9:
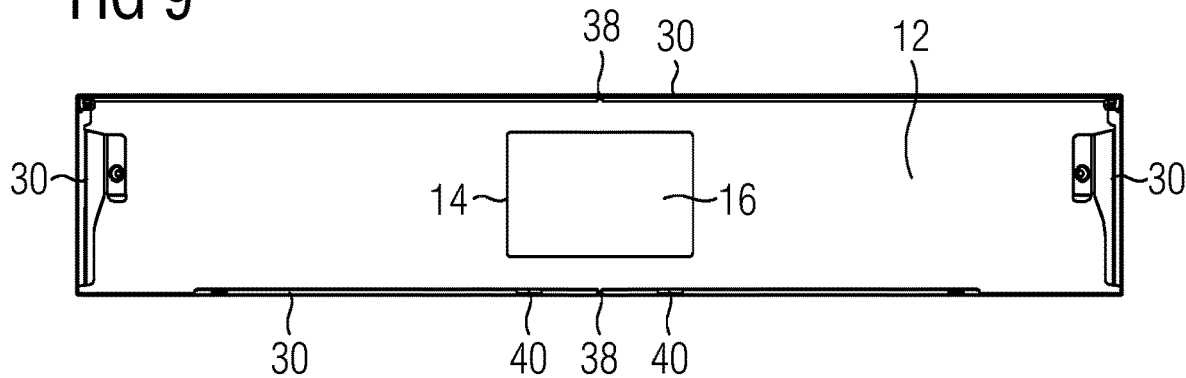
Figure 10:
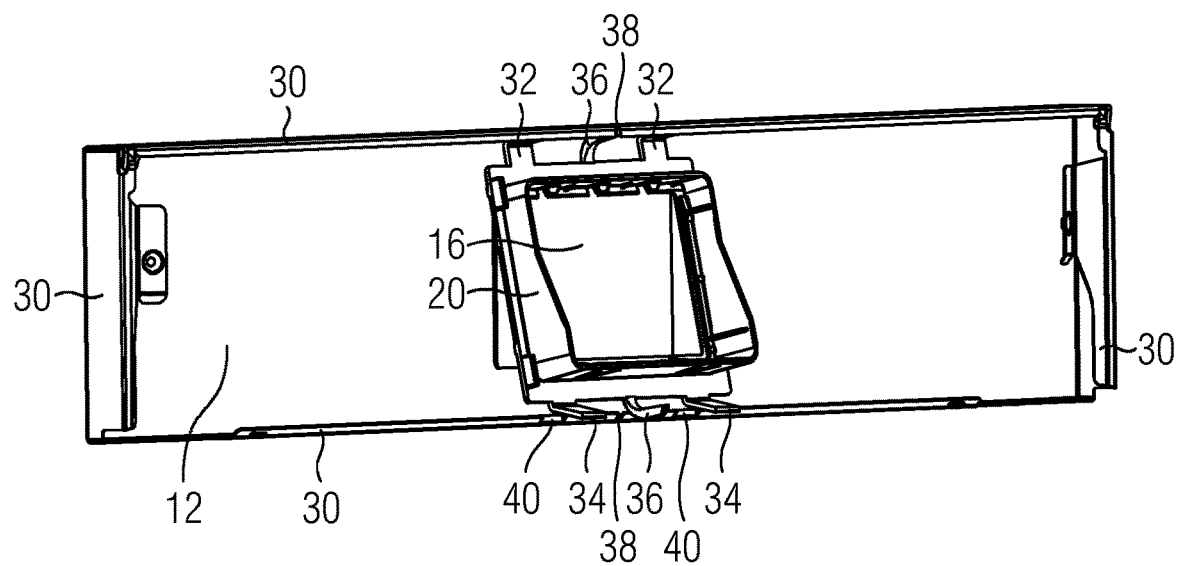
Figure 11:
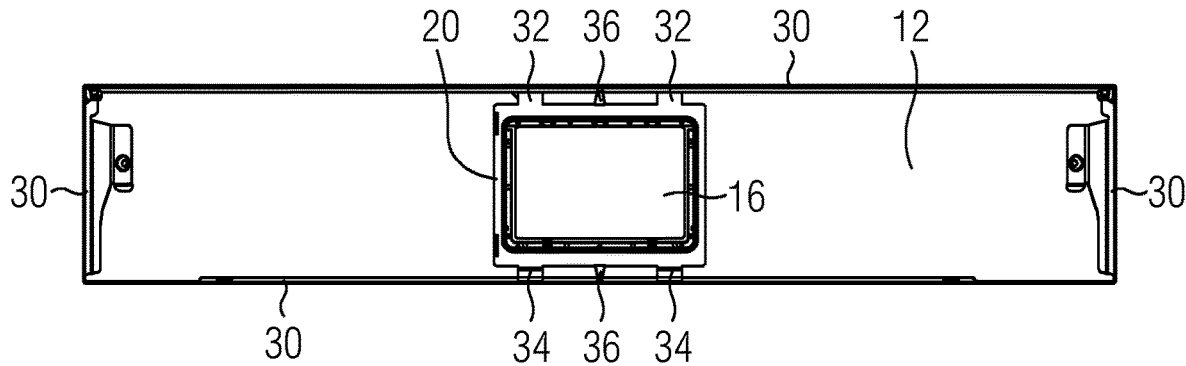
Figure 12:
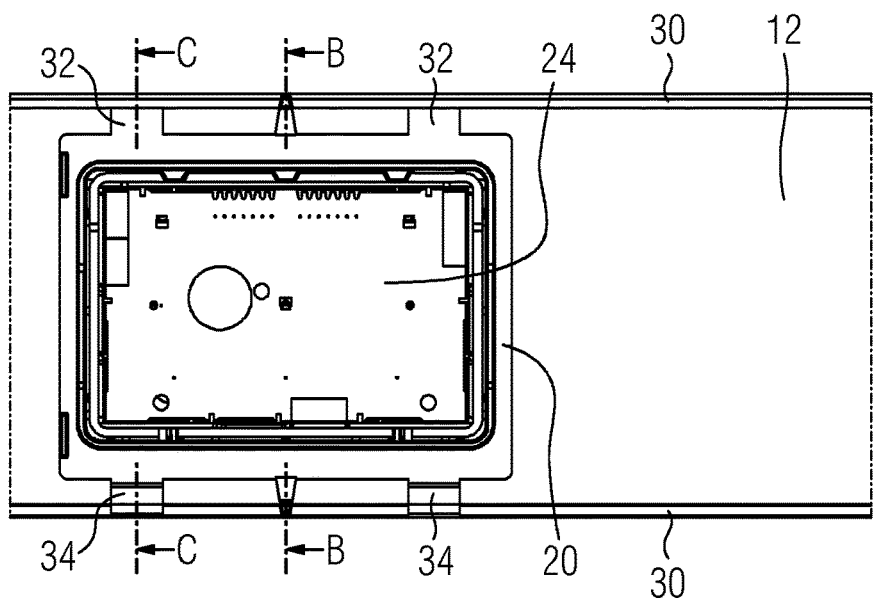
Figure 13:
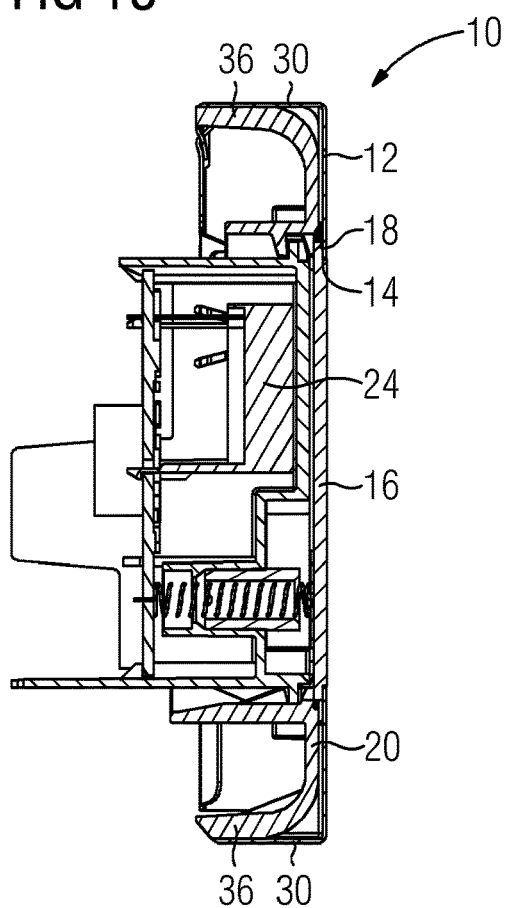
Figure 14:
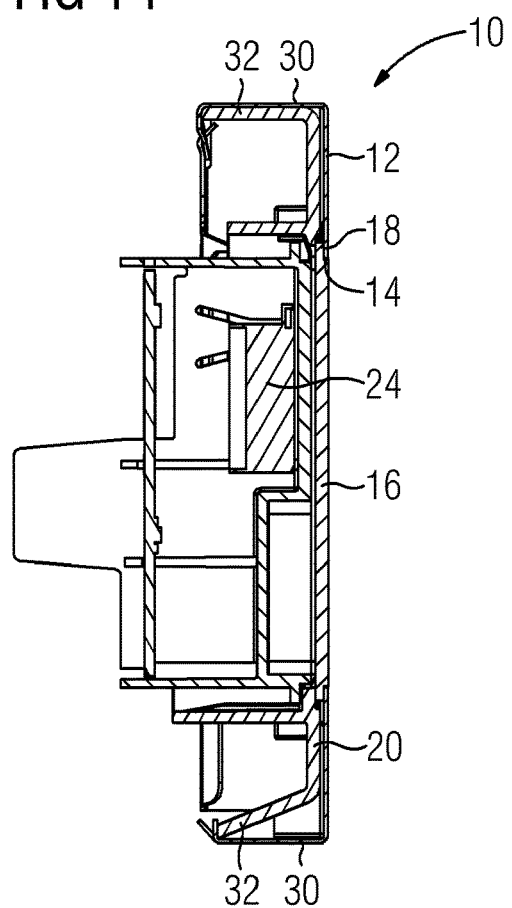
Figure 15:
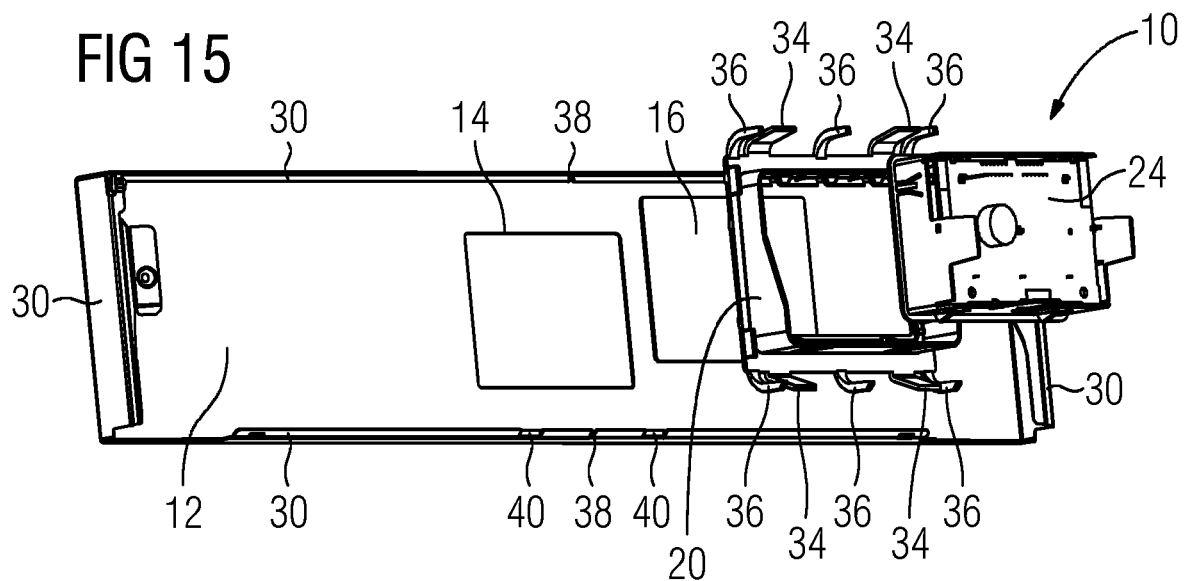
Figure 16:
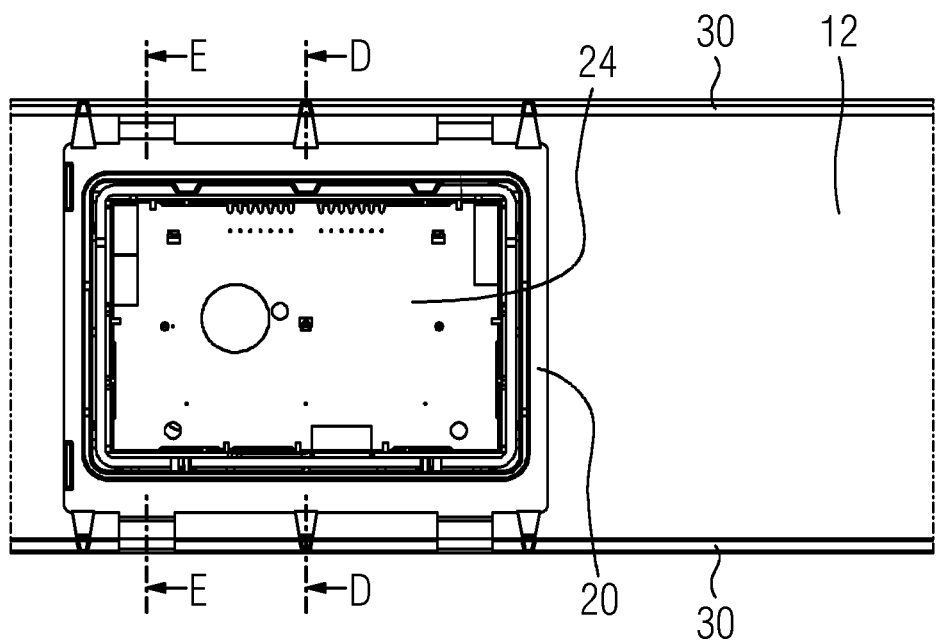
Figure 17:
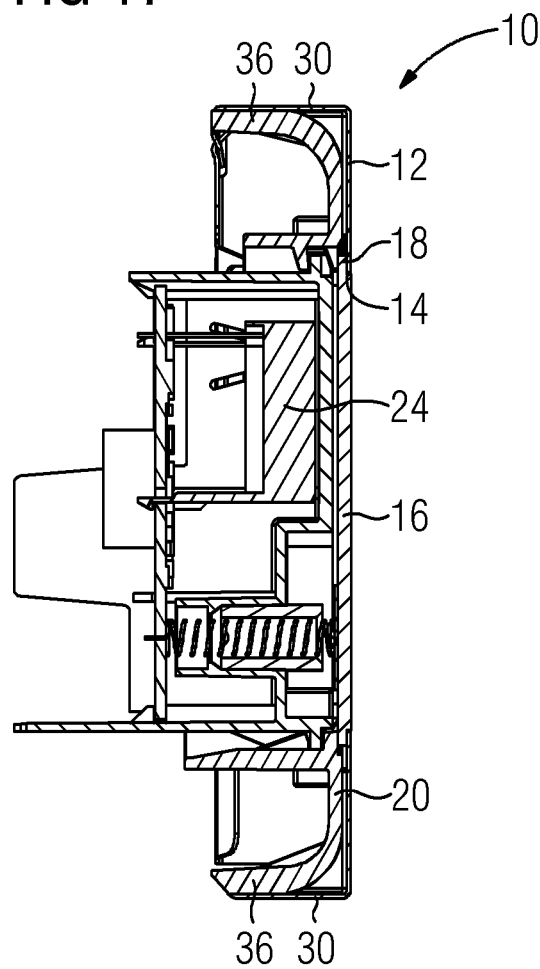
Figure 18:
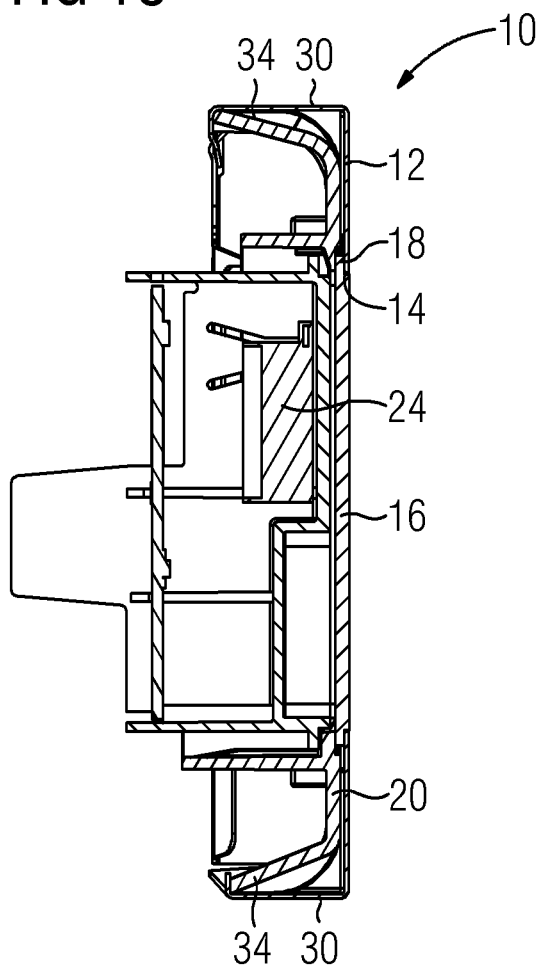
Figure 19:
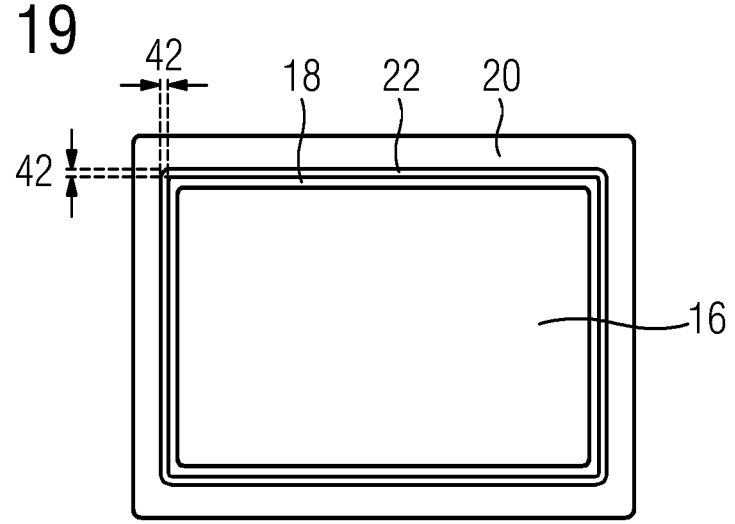

The present invention will be described in further detail with reference to the drawings, in which FIG. 1 illustrates a schematic exploded perspective front view of a control panel according to a first embodiment of the present invention, FIG. 2 illustrates a schematic rear view of a front panel and an inner panel for the control panel according to the first embodiment of the present invention, FIG. 3 illustrates a schematic rear view of the front panel, the inner panel and a support frame for the control panel according to the first embodiment of the present invention, FIG. 4 illustrates a schematic rear view of the front panel and the inner panel for the control panel according to the first embodiment of the present invention, FIG. 5 illustrates a schematic rear view of the front panel, the inner panel and the support frame for the control panel according to the first embodiment of the present invention, FIG. 6 illustrates a schematic detailed rear view of the control panel according to the first embodiment of the present invention, FIG. 7 illustrates a schematic sectional side view of the control panel according to the first embodiment of the present invention, FIG. 8 illustrates a schematic exploded perspective rear view of the control panel according to a second embodiment of the present invention, FIG. 9 illustrates a schematic rear view of the front panel and the inner panel for the control panel according to the second embodiment of the present invention, FIG. 10 illustrates a schematic perspective rear view of the front panel, the inner panel and the support frame for the control panel according to the second embodiment of the present invention, FIG. 11 illustrates a schematic rear view of the front panel, the inner panel and the support frame for the control panel according to the second embodiment of the present invention, FIG. 12 illustrates a schematic detailed rear view of the control panel according to the second embodiment of the present invention, FIG. 13 illustrates a schematic sectional side view of the control panel according to the second embodiment of the present invention, FIG. 14 illustrates a further schematic sectional side view of the control panel according to the second embodiment of the present invention, FIG. 15 illustrates a schematic exploded perspective rear view of the control panel according to a third embodiment of the present invention, FIG. 16 illustrates a schematic detailed rear view of the control panel according to the third embodiment of the present invention, FIG. 17 illustrates a schematic sectional side view of the control panel according to the third embodiment of the present invention, FIG. 18 illustrates a further schematic sectional side view of the control panel according to the third embodiment of the present invention, FIG. 19 illustrates a schematic front view of the support frame and the inner panel according to the present invention, FIG. 20 illustrates a schematic front view of the front panel and the inner panel according to the present invention, and FIG. 21 illustrates a schematic exploded perspective front view of the control panel according to the prior art.

FIG. 1 illustrates a schematic exploded perspective front view of a control panel 10 according to a first embodiment of the present invention. For example, the control panel 10 is provided for a domestic appliance. In general, the control panel 10 may be provided for an arbitrary apparatus.

The control panel 10 comprises a front panel 12, an inner panel 16, a support frame 20 and a user interface 24. For example, the front panel 12 is made of metal. Further, the front panel 12 may be made of plastics. Preferably, the inner panel 16 is transparent or at least partially transparent. For example, the inner panel 16 is made of glass or plastics. In particular, the user interface 24 includes at least one control and/or display device. The front panel 12 includes a cut-out 14. In this example, said cut-out 14 is rectangular and arranged in the centre of the front panel 12. In general, the cut-out 14 may have an arbitrary shape. Further, the front panel 12 includes foldings 30 at the border.

The inner panel 16 includes a peripheral rabbet 18. Said peripheral rabbet 18 encloses at least partially the circumference of the inner panel 16. In this example, the peripheral rabbet 18 encloses completely the circumference of the inner panel 16. The front side of the inner panel 16 is smaller than the rear side of said inner panel 16. The inner panel 16 consists of a flat front portion and a flat rear portion, wherein the large-area side of the flat front portion is smaller than the large-area side of the flat rear portion. Preferably, the inner panel 16 is at least partially transparent.

The support frame 20 includes a recess 22 at its front side. The user interface 24 is fastened or fixable at the rear side of the support frame 20. Preferably, the user interface 24 is fastened or fixable at the rear side of the support frame 20 by at least one snap-in mechanism. The flat rear portion of the inner panel 16 is received or receivable by the recess 22 of the support frame 20, while the flat front portion of the inner panel 16 is received or receivable by the cut-out 14 of the front panel 12.

The large-area side of the flat front portion of the inner panel 16 is marginally smaller than the area of the cut-out 14 of the front panel 12. Preferably, the thickness of the flat front portion of the inner panel 16 corresponds with the thickness of the front panel 12. In this case, the front sides of the inner panel 16 and front panel 12 are arranged in the same plane, when the flat front portion of the inner panel 16 is received by the cut-out 14 of the front panel 12.

The deepness of the recess 22 of the support frame 20 corresponds with the thickness of the flat rear portion of the inner panel 16, so that the inner panel 16 can be pressed against the rear side of the front panel 12 by said support frame 20. The large-area side of the flat rear portion of the inner panel 16 is smaller than the large-area side of the recess 22 of the support frame 20, so that manufacturing tolerances of the inner panel 16 and/or the support frame 20 can be compensated.

FIG. 2 illustrates a schematic rear view of the front panel 12 and the inner panel 16 for the control panel 10 according to the first embodiment of the present invention.

The inner panel 16 is aligned at the front panel 12, wherein the flat front portion of the inner panel 16 is received by the cut-out 14 of the front panel 12. Two glue tracks 26 are deposited at the rear side of the front panel 12, wherein said glue tracks 26 enclose partially the inner panel 16 and the cut-out 14. In general, an arbitrary number of glue tracks 26 may enclose the inner panel 16 and the cut-out 14.

FIG. 2 shows first steps of a method for assembling the control device 10. At first, the inner panel 16 is aligned at the front panel 12 and then the glue tracks 26 are deposited at the rear side of said front panel 12. Alternatively, the glue tracks 26 are firstly deposited at the rear side of said front panel 12 and then the inner panel 16 is aligned at the front panel 12. In both cases, the flat front portion of the inner panel 16 is received by the cut-out 14 of the front panel 12.

FIG. 3 illustrates a schematic rear view of the front panel 12, the inner panel 16 and the support frame 20 for the control panel 10 according to the first embodiment of the present invention.

The support frame 20 is attached at the rear side of the front panel 12 by the glue tracks 26. The inner panel 16 is fastened between the support frame 20 and the front panel 12, wherein the flat rear portion of the inner panel 16 is received by the recess 22 of the support frame 20, while the flat front portion of the inner panel 16 is received by the cut-out 14 of the front panel 12.

FIG. 3 shows a further step of the method for assembling the control device 10. The support frame 20 is put to the rear side of the front panel 12, wherein the recess 22 of said support frame 20 receives the flat rear portion of the inner panel 16. By this way, the inner panel 16 is fastened between the support frame 20 and the front panel 12.

FIG. 4 illustrates a schematic rear view of the front panel 12 and the inner panel 16 for the control panel 10 according to the first embodiment of the present invention.

The front panel 12 and the glue tracks 26 in FIG. 4 are similar to those in FIG. 2. However, the border of the flat rear portion of the inner panel 16 includes corrugations 28.

In this example, the upper and lower borders of the flat rear portion of the inner panel 16 includes corrugations 28. Said corrugations 28 are optional for the border of the flat rear portion of the inner panel 16. The corrugations 28 improve that a part of the glue from the glue tracks 26 flows into the space between the recess 22 of the support frame 20 and the border of the flat rear portion of the inner panel 16.

FIG. 5 illustrates a schematic rear view of the front panel, the inner panel and the support frame for the control panel according to the first embodiment of the present invention. FIG. 5 is similar to FIG. 3, wherein the borders of the flat rear portion of the inner panel 16 include the corrugations 28.

The support frame 20 is attached at the rear side of the front panel 12 by the glue tracks 26, so that the inner panel 16 is fastened between the support frame 20 and the front panel 12. The flat rear portion of the inner panel 16 is received by the recess 22 of the support frame 20, while the flat front portion of the inner panel 16 is received by the cut-out 14 of the front panel 12.

FIG. 6 illustrates a schematic detailed rear view of the control panel 10 according to the first embodiment of the present invention.

The support frame 20 is glued at the rear side of the front panel 12. The inner panel 16 is fastened between the support frame 20 and the front panel 12. The flat rear portion of the inner panel 16 is received by the recess 22 of the support frame 20, while the flat front portion of the inner panel 16 is received by the cut-out 14 of the front panel 12. The user interface 24 is attached at the support frame 20 by the at least one snap-in mechanism.

FIG. 7 illustrates a schematic sectional side view of the control panel 10 according to the first embodiment of the present invention. FIG. 7 shows the schematic sectional side view along the line A-A in FIG. 6.

The inner panel 16 is fastened between the support frame 20 and the front panel 12, wherein the support frame 20 is glued at the rear side of the front panel 12. The flat front portion of the inner panel 16 is received by the cut-out 14 of the front panel 12. The flat front portion of the inner panel 16 and the cut-out 14 of the front panel 12 are complementary to each other. The front sides of the inner panel 16 and the front panel 12 lie in the same plane. The flat rear portion of the inner panel 16 is received by the recess 22 of the support frame 20. The flat rear portion of the inner panel 16 and the recess 22 of the support frame 20 are complementary to each other. The user interface 24 is attached at the support frame 20 by one or more snap-in mechanisms.

FIG. 8 illustrates a schematic exploded perspective rear view of the control panel 10 according to a second embodiment of the present invention.

The control panel 10 comprises the front panel 12, the inner panel 16, the support frame 20 and the user interface 24. The front panel 12 includes the cut-out 14. In this example, said cut-out 14 is rectangular and arranged in the centre of the front panel 12. Further, the front panel 12 includes the foldings 30 at the border. The upper and lower foldings 30 of the front panel 12 form a groove in each case.

The support frame 20 includes hook elements 32, snap-in elements 34 and locating pins 36. In this example, the support frame 20 includes two hook elements 32 at the upper side and two snap-in elements 34 at the lower side. Two locating pins 36 are arranged in the centres of the upper and lower sides, respectively. A notch 38 is formed in the upper folding 30 of the front panel 12. A further notch 38 is formed in the lower folding 30 of the front panel 12. Said notches 38 are provided for receiving the locating pins 36 of the support frame 20 in each case. Two flaps 40 are formed in the lower folding 30 of the front panel 12. The flaps 40 are provided for receiving the snap-in elements 34 of the support frame 20 in each case. The snap-in elements 34 of the flaps 40 form a snap-in mechanism. The groove of the upper folding 30 of the front panel is provided for receiving the hook elements 32 of the support frame 20. The support frame 20 is clamped or clampable between the upper and lower foldings 30 of the front panel 12, wherein the inner panel 16 is supported between the front panel 12 and the support frame 20.

FIG. 9 illustrates a schematic rear view of the front panel 12 and the inner panel 16 for the control panel 10 according to the second embodiment of the present invention.

The notches 38 are formed in the centres of the upper and lower foldings 30 of the front panel 12. The flaps 40 are formed in the lower folding 30 of the front panel 12 at both sides of the notch 38 in the lower folding 30.

FIG. 10 illustrates a schematic perspective rear view of the front panel 12, the inner panel 16 and the support frame 20 for the control panel 10 according to the second embodiment of the present invention.

The inner panel 16 is received by the cut-out 14 of the front panel 12. The support frame 20 is partially mounted at the rear side of the front panel 12. The hook elements 32 of the support frame 20 are received by the groove formed by the upper folding 30 of the front panel. The upper locating pin 36 of the support frame 20 is received by the notch 38 in the upper folding 30 of the front panel 12. The snap-in elements 34 of the support frame 20 are arranged in front of the corresponding flaps 40. The lower locating pin 36 of the support frame 20 is arranged in front of the notch 38 in the lower folding 30 of the front panel 12.

FIG. 10 shows a step of fastening the support frame 20 at the rear side of the front panel 12, wherein the hook elements 32 and the upper locating pin 36 of the support frame 20 are received by the upper folding 30 of the front panel 12, while the snap-in elements 34 and the lower locating pin 36 are not yet received by the lower folding 30 of the front panel 12.

FIG. 11 illustrates a schematic rear view of the front panel 12, the inner panel 16 and the support frame 20 for the control panel 10 according to the second embodiment of the present invention.

The support frame 20 is completely mounted at the rear side of the front panel 12. The hook elements 32 of the support frame 20 are received by the groove formed by the upper folding 30 of the front panel. The locating pins 36 of the support frame 20 are received by the notches 38 in the upper and lower foldings 30 of the front panel 12. The snap-in elements 34 of the support frame 20 are received by the corresponding flaps 40 in the lower folding 30 of the front panel 12.

FIG. 11 shows a step, in which the support frame 20 has been fastened at the rear side of the front panel 12. According to the second embodiment, at first the upper portion of the support frame 20 is received by the upper folding 30 of the front panel 12 and then the lower portion of the support frame 20 is received by the lower folding 30 of the front panel 12.

FIG. 12 illustrates a schematic detailed rear view of the control panel 10 according to the second embodiment of the present invention.

The support frame 20 is clamped at the rear side of the front panel 12. The hook elements 32 of the support frame 20 are received by the upper folding 30 of the front panel 12. The locating pins 36 of the support frame 20 are received by the notches 38 in the upper and lower foldings 30 of the front panel 12. The snap-in elements 34 of the support frame 20 are received by the corresponding flaps 40 in the lower folding 30 of the front panel 12. The user interface 24 is fixed at the support frame 20 by the snap-in mechanism.

FIG. 13 illustrates a schematic sectional side view of the control panel 10 according to the second embodiment of the present invention. FIG. 13 shows the schematic sectional side view along the line B-B in FIG. 12.

The inner panel 16 is fastened between the support frame 20 and the front panel 12, wherein the support frame 20 is clamped between the upper and lower foldings 30 of the front panel 12. The flat front portion of the inner panel 16 is received by the cut-out 14 of the front panel 12. The flat front portion of the inner panel 16 and the cut-out 14 of the front panel 12 are complementary to each other. The front sides of the inner panel 16 and the front panel 12 form a common plane. The flat rear portion of the inner panel 16 is received by the recess 22 of the support frame 20. The flat rear portion of the inner panel 16 and the recess 22 of the support frame 20 are complementary to each other. The user interface 24 is attached at the support frame 20 by one or more snap-in mechanisms.

The upper and lower locating pins 36 of the support frame 20 are aligned at the inner sides of the upper and lower foldings 30, respectively, of the front panel 12. Further, the locating pins 36 of the support frame 20 are received by the notches 38 in the upper and lower foldings 30 of the front panel 12.

FIG. 14 illustrates a further schematic sectional side view of the control panel 10 according to the second embodiment of the present invention. FIG. 14 shows the schematic sectional side view along the line C-C in FIG. 12.

The hook elements 32 of the support frame 20 are aligned at the inner side of the upper folding 30 of the front panel 12. The snap-in elements 34 of the support frame 20 are aligned at the inner side of the lower folding 30 of the front panel 12.

A first section of the lower folding 30 and the front side of the front panel 12 form a right angle. The first section of the lower folding 30 is directly connected to the front side of the front panel 12. A second section and the first section of the lower folding 30 form a right angle. The second section of the lower folding 30 is directly connected to the first section and opposite to the front side of the front panel 12. In contrast, the flaps 40 and the second section of the lower folding 30 form an obtuse angle.

FIG. 15 illustrates a schematic exploded perspective rear view of the control panel 10 according to a third embodiment of the present invention.

The control panel 10 comprises the front panel 12, the inner panel 16, the support frame 20 and the user interface 24. The front panel 12 includes the cut-out 14. In this example, said cut-out 14 is rectangular and arranged in the centre of the front panel 12. Further, the front panel 12 includes the foldings 30 at the border. The upper and lower foldings 30 of the front panel 12 form a groove in each case.

The support frame 20 includes snap-in elements 34 and locating pins 36. In this example, the support frame 20 includes two snap-in elements 34 at the upper side and two snap-in elements 34 at the lower side. Further, the support frame 20 includes three locating pins 36 at the upper and lower sides in each case. Corresponding notches 28 are formed in the upper and lower foldings 30 of the front panel 12. Said notches 38 are provided for receiving the corresponding locating pins 36 of the support frame 20. Two flaps 40 are formed in the lower folding 30 of the front panel 12. The flaps 40 are provided for receiving the snap-in elements 34 in the lower side of the support frame 20 in each case. The snap-in elements 34 and the flaps 40 form a snap-in mechanism. The groove of the upper folding 30 of the front panel is provided for receiving the snap-in elements 34 in the upper side of the support frame 20. The support frame 20 is clamped or clampable between the upper and lower foldings 30 of the front panel 12, wherein the inner panel 16 is supported between the front panel 12 and the support frame 20.

FIG. 16 illustrates a schematic detailed rear view of the control panel 10 according to the third embodiment of the present invention.

The support frame 20 is clamped at the rear side of the front panel 12. The snap-in elements 34 of the support frame 20 are received by the upper and lower foldings 30 of the front panel 12. The locating pins 36 of the support frame 20 are received by the notches 38 in the upper and lower foldings 30 of the front panel 12. The user interface 24 is fixed at the support frame 20 by the snap-in mechanism.

FIG. 17 illustrates a schematic sectional side view of the control panel 10 according to the third embodiment of the present invention. FIG. 17 shows the schematic sectional side view along the line D-D in FIG. 16.

The inner panel 16 is fastened between the support frame 20 and the front panel 12, wherein the support frame 20 is clamped between the upper and lower foldings 30 of the front panel 12. The flat front portion of the inner panel 16 is received by the cut-out 14 of the front panel 12. The flat front portion of the inner panel 16 and the cut-out 14 of the front panel 12 are complementary to each other. The front sides of the inner panel 16 and the front panel 12 form a common plane, so that the front side of the control panel 10 is smooth. The flat rear portion of the inner panel 16 is received by the recess 22 of the support frame 20. The flat rear portion of the inner panel 16 and the recess 22 of the support frame 20 are substantially complementary to each other. The user interface 24 is attached at the support frame 20 by one or more snap-in mechanisms.

The upper and lower locating pins 36 of the support frame 20 are aligned at the inner sides of the upper and lower foldings 30, respectively, of the front panel 12. Further, the locating pins 36 of the support frame 20 are received by the corresponding notches 38 in the upper and lower foldings 30 of the front panel 12.

FIG. 18 illustrates a further schematic sectional side view of the control panel 10 according to the third embodiment of the present invention. FIG. 18 shows the schematic sectional side view along the line E-E in FIG. 16.

The snap-in elements 34 of the support frame 20 are aligned at the inner side of the upper and lower foldings 30 of the front panel 12. The control panel 10 according to the third embodiment allows the connection between the support frame 20 and the front panel 12 by a linear movement of said support frame 20 towards the front panel 12.

FIG. 19 illustrates a schematic front view of the support frame 20 and the inner panel 16 according to the present invention.

The flat rear portion of the inner panel 16 with the peripheral rabbet 18 is received by the recess 22 of the support frame 20, while the flat front portion of the inner panel 16 is arranged in front of said recess 22. A gap 42 is formed between the circumferences of the peripheral rabbet 18 and the recess 22, so that manufacturing tolerances of the inner panel 16 and/or the support frame 20 can be compensated.

FIG. 20 illustrates a schematic front view of the front panel 12 and the inner panel 16 according to the present invention.

The flat front portion of the inner panel 16 is arranged in the cut-out 18 of the front panel 12. A narrow gap 44 is formed between the circumferences of the flat front portion of the inner panel 16 and the cut-out 18 of the front panel 12, so that the front sides of the front panel 12 and inner panel 16 appear as a homogeneous surface.

FIG. 21 illustrates a schematic exploded perspective front view of the control panel 10 according to the prior art.

The control panel 10 comprises the front panel 12, the inner panel 16, the support frame 20 and the user interface 24. The front panel 12 includes the cut-out 14. The inner panel 16 is transparent or at least partially transparent. The inner panel 16 is attached at the rear side of the front panel 12 and behind the cut-out 14. The support frame 20 is fixed at the rear side of the inner panel 16. In turn, the user interface 24 is snapped in at the support frame 20. However, the cut-out 14 forms an edge in front of the inner panel 16.

In contrast, the control panel 10 according to the present invention includes a flush surface at the front sides of the front panel 12 and inner panel 16. Further, the control panel 10 of the present invention can be automatically assembled by a robot.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

LIST OF REFERENCE NUMERALS

10 control panel
12 front panel
14 cut-out
16 inner panel
18 peripheral rabbet
20 support frame
22 recess
24 user interface
26 glue track
28 corrugation
30 folding
32 hook element
34 snap-in element
36 locating pin
38 notch
40 flap
42 gap
44 narrow gap

The invention claimed is:

1. A control panel for an apparatus, comprising:
a front panel including a cut-out,
an inner panel including a peripheral rabbet that encloses at least partially a circumference of the inner panel, so that a smaller flat front portion and a bigger flat rear portion of said inner panel are formed, and
a support frame including a recess at its front side, the support frame being connected or connectable to a rear side of the front panel,
wherein the inner panel is arranged or arrangeable between the front panel and the support frame, so that the flat front portion of the inner panel is received or receivable by the cut-out of the front panel, while the flat rear portion of the inner panel is received or receivable by the recess of the support frame.

2. The control panel according to claim 1, wherein the inner panel is at least partially transparent.

3. The control panel according to claim 1, further comprising a user interface fixed or fixable at a rear side of the support frame.

4. The control panel according to claim 3, wherein the user interface is fixed or fixable at the rear side of the support frame by a snap-in mechanism.

5. The control panel according to claim 1, wherein the cut-out of the front panel is marginally bigger than the flat front portion of the inner panel, so that a narrow gap is formed between circumferences of the cut-out of the front panel and the flat front portion of the inner panel.

6. The control panel according to claim 1, wherein the recess of the support frame is bigger than the flat rear portion of the inner panel, so that a gap is formed between circumferences of the recess of the support frame and the flat rear portion of the inner panel.

7. The control panel according to claim 6, wherein the gap between the circumferences of the recess of the support frame and the flat rear portion of the inner panel is bigger than a narrow gap between circumferences of the cut-out of the front panel and the flat front portion of the inner panel.

8. The control panel according to claim 1, wherein the support frame is fixed or fixable at the rear side of the front panel by gluing.

9. The control panel according to claim 1, wherein the support frame is fixed or fixable at the rear side of the front panel by clamping said support frame between two opposite foldings arranged at two opposite borders of said front panel.

10. The control panel according to claim 9, wherein the support frame includes hook elements and/or snap-in elements for hooking and/or snapping, respectively, said support frame into the foldings of the front panel.

11. The control panel according to claim 10, wherein the support frame includes a locating pin inserted in or insertable into a corresponding notch formed in the folding of the front panel.

12. The method according to claim 1, wherein the support frame is connected to the rear side of the front panel by clamping said support frame between two opposite foldings arranged at two opposite borders of said front panel.

13. A method for assembling a control panel for an apparatus, wherein the method comprises the steps of:
providing a front panel including a cut-out,
providing an inner panel including a peripheral rabbet enclosing at least partially a circumference of said inner panel, so that a smaller flat front portion and a bigger flat rear portion of said inner panel are formed,
providing a support frame including a recess at its front side,
inserting the flat front portion of the inner panel into the cut-out of the front panel,
connecting the support frame to a rear side of the front panel, so that the flat rear portion of the inner panel is received by the recess of the support frame and the inner panel is arranged between the front panel and the support frame.

14. The method according to claim 13, wherein the support frame is connected to the rear side of the front panel by:
depositing a glue track onto the rear side of the front panel, and
setting the support frame onto said glue track.

15. A control panel for an apparatus, comprising: a front panel having a front surface, a rear surface, and a cut-out therein; an at least partially transparent inner panel defining a rear portion and flat front portion, and having rabbet disposed about its circumference such that said front portion is smaller than said rear portion; and a support frame having a recess at its front side; the rear portion of the inner panel being received and fixed via a snap-in connection within the recess at the front side of the support frame; the support frame being connected directly to the rear surface of the front panel via at least one of a snap-in connection or gluing so that the flat front portion of the inner panel is received within the cut-out of the front panel and is disposed in a common plane with the front surface thereof; wherein said inner panel is thus sandwiched between said front panel and said support frame and there is no separate fixation between the inner panel and the front panel.

16. The control panel according to claim 15, further comprising a user interface fixed at a rear side of the support frame via a snap-in connection so that said user interface is visible from in front of said front panel through said at least partially transparent inner panel.

17. The control panel according to claim 15, the support frame further comprising hooks and/or snap-in elements, said support frame being connected to the rear side of the front panel by clamping said support frame between opposite foldings arranged at opposite borders of the front panel via said hooks and/or said snap-in elements.

* * * * *